(12) United States Patent
Yin

(10) Patent No.: US 11,329,238 B2
(45) Date of Patent: May 10, 2022

(54) FLEXIBLE ORGANIC LIGHT EMITTING DIODE DISPLAY PANEL AND FOLDABLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Xuebing Yin, Wuhan (CN)

( * ) Notice: Subject to any disclaimer, the term of this patent is extended or adjusted under 35 U.S.C. 154(b) by 247 days.

(21) Appl. No.: 16/630,867

(22) PCT Filed: Nov. 5, 2019

(86) PCT No.: PCT/CN2019/115677
§ 371 (c)(1),
(2) Date: Jan. 14, 2020

(87) PCT Pub. No.: WO2021/035949
PCT Pub. Date: Mar. 4, 2021

(65) Prior Publication Data
US 2021/0408404 A1 Dec. 30, 2021

(30) Foreign Application Priority Data
Aug. 29, 2019 (CN) .......................... 201910805535.9

(51) Int. Cl.
*H01L 51/00* (2006.01)

(52) U.S. Cl.
CPC .. *H01L 51/0097* (2013.01); *H01L 2251/5338* (2013.01)

(58) Field of Classification Search
None
See application file for complete search history.

(56) References Cited

U.S. PATENT DOCUMENTS

| 10,644,074 | B2* | 5/2020 | Leng | H01L 27/3244 |
| 2017/0373121 | A1* | 12/2017 | Leng | H01L 27/3244 |
| 2018/0004252 | A1* | 1/2018 | Ahrens | G06F 1/1652 |
| 2019/0165311 | A1* | 5/2019 | Lee | H01L 51/5246 |
| 2020/0411777 | A1* | 12/2020 | Seo | H01L 51/0097 |

FOREIGN PATENT DOCUMENTS

| CN | 109004001 A | 12/2018 |
| CN | 109036131 A | 12/2018 |
| CN | 109196448 A | 1/2019 |
| CN | 110085640 A | 8/2019 |
| JP | 2004079325 A | 3/2004 |

* cited by examiner

*Primary Examiner* — J. E. Schoenholtz

(57) ABSTRACT

A flexible organic light emitting diode (OLED) display panel and a foldable display device are provided. The flexible OLED display panel includes a flexible substrate and an elastic material layer. The flexible substrate includes a folding zone and two non-folding zones located on left and right sides of the folding zone. The elastic material layer is disposed over a bottom surface corresponding to the folding zone of the flexible substrate.

8 Claims, 4 Drawing Sheets

FLEXIBLE ORGANIC LIGHT EMITTING DIODE DISPLAY PANEL AND FOLDABLE DISPLAY DEVICE

FIELD OF INVENTION

The present invention relates to the display technology, and more particularly, to a flexible organic light emitting diode display panel and a foldable display device.

BACKGROUND

Organic light emitting diode (OLED) display devices have many advantages such as light weight and thinness, active illumination, fast response time, wide viewing angles, wide color gamut, high brightness, and low power consumption. Therefore, OLED display devices have received widespread attention in recent years.

Along with the rapid advancement of flexible electronic display devices, OLED display devices have also tended to adopt flexible and foldable or bendable designs. However, after dynamically and repeatedly folding thereof for many times, the folding zone of the OLED display panel cannot be completely restored from the folded state to the initial state (i.e. the fully flat unfolded state of the display panel) due to fatigue of material property, thereby affecting the service life of the flexible electronic display.

Therefore, it is necessary to provide a flexible organic light emitting diode display panel and a foldable display device to solve the problems of the prior art.

SUMMARY

After dynamically and repeatedly folding thereof for many times, the folding zone of the OLED display panel cannot be completely restored from the folded state to the initial state (i.e. the fully flat unfolded state of the display panel) due to fatigue of material property, thereby affecting the service life of the flexible electronic display.

It is an object of the present invention to provide a flexible organic light emitting diode display panel and a foldable display device to solve the technical problem that the display panel cannot be completely restored from the folded state to the initial state in the conventional techniques.

In order to solve the above technical problems, the present invention provides a flexible organic light emitting diode (OLED) display panel. The flexible organic light emitting diode display panel comprises a flexible substrate and an elastic material layer. The flexible substrate comprises a folding zone and two non-folding zones located on left and right sides of the folding zone. The elastic material layer is disposed over a bottom surface corresponding to the folding zone of the flexible substrate.

In the flexible organic light emitting diode display panel of the invention, the elastic material layer has a pattern composed of a single rectangular body, a plurality of rectangular bodies arranged side-by-side with a fixed gap therebetween, or a plurality of elliptical annular bodies arranged side-by-side with a fixed gap therebetween.

In the flexible organic light emitting diode display panel of the invention, the elastic material layer is made of an elastic metal alloy or an elastic polymer material.

In the flexible organic light emitting diode display panel of the invention, the elastic metal alloy is an iron-based elastic alloy, a cobalt-based elastic alloy, or a nickel-based elastic alloy.

In the flexible organic light emitting diode display panel of the invention, the elastic polymer material is styrene-butadiene rubber or nitrile-butadiene rubber.

The present invention further provides a foldable display device, and the foldable display device comprises a flexible organic light emitting diode display panel. The flexible organic light emitting diode display panel comprises a flexible substrate and an elastic material layer. The flexible substrate comprises a folding zone and two non-folding zones located on left and right sides of the folding zone. The elastic material layer is disposed over a bottom surface corresponding to the folding zone of the flexible substrate.

In the folding display device of the present invention, the elastic material layer has a pattern composed of a single rectangular body, a plurality of rectangular bodies arranged side-by-side with a fixed gap therebetween, or a plurality of elliptical annular bodies arranged side-by-side with a fixed gap therebetween.

In the folding display device of the present invention, the elastic material layer is made of an elastic metal alloy or an elastic polymer material.

In the foldable display device of the present invention, the elastic metal alloy is an iron-based elastic alloy, a cobalt-based elastic alloy, or a nickel-based elastic alloy.

In the foldable display device of the present invention, the elastic polymer material is styrene-butadiene rubber or nitrile-butadiene rubber.

The advantageous effects of the present application are: Compared with the prior art, the present invention provides a flexible organic light emitting diode display panel and a foldable display device. According to the present invention, an elastic material is disposed over the bottom surface of the flexible substrate corresponding to a folding zone. Therefore, the elastic material layer can rapidly return to the original flat shape during the process of unfolding the display panel from a folded state to the initial state, thereby solving the technical problems that the display panel cannot be completely restored from the folded state to the initial state due to fatigue of material property after dynamically and repeatedly folding thereof for many times.

BRIEF DESCRIPTION OF DRAWINGS

To detailly explain the technical schemes of the embodiments or existing techniques, drawings that are used to illustrate the embodiments or existing techniques are provided. Obviously, the illustrated embodiments are only some embodiments of the present disclosure. It is easy for any person having ordinary skill in the art to obtain other drawings without labor for inventiveness.

DETAILED DESCRIPTION

Figure 1A:
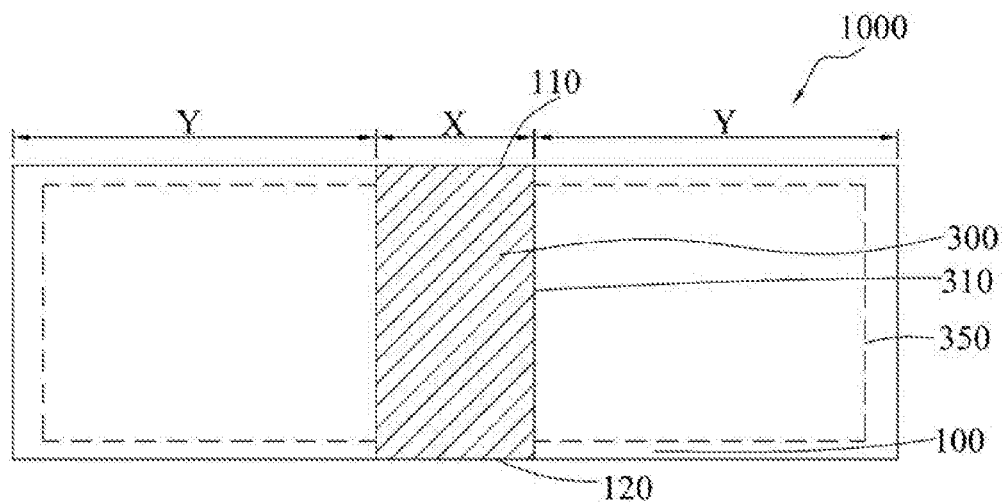
FIG. 1A is a bottom view of a first structure of a flexible organic light emitting diode (OLED) display panel according to an embodiment of the present invention.

The following description of the embodiments refer to the appended drawings to illustrate the present invention. The following description is based on the specific embodiments of the present invention as illustrated and should not be construed as limiting the specific embodiments that are not described herein. The directional terms mentioned in the present invention, such as "upper", "lower", "before", "after", "left", "right", "inside", "outside", "side", etc., are only used to show direction in the figures. The directional terms used in the drawings are used to explain and understand the present invention and are not intended to limit the scope of the invention. In the drawings, structurally identical components are denoted by the same reference numerals, and structural or functionally similar components are denoted by like reference numerals.

Embodiments of the present invention provide a flexible organic light emitting diode display panel, which will be described in detail below.

Figure 1B:
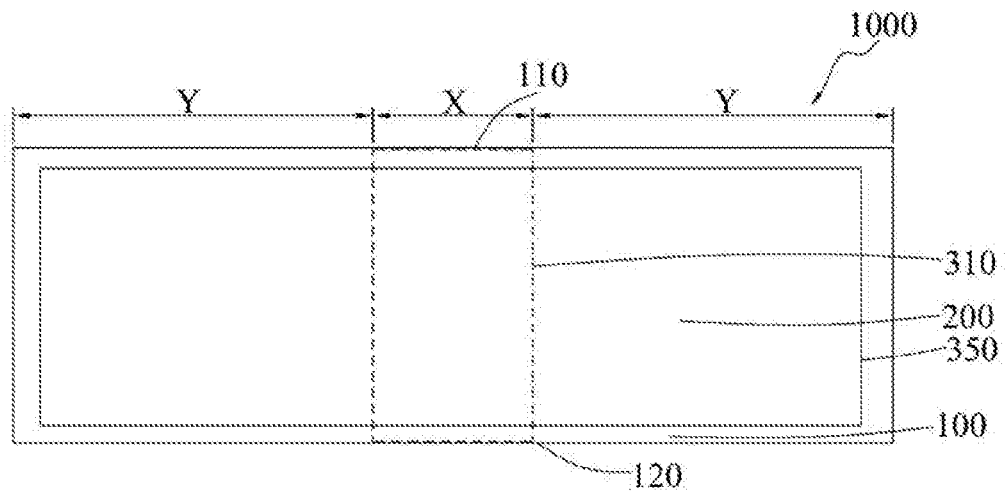
FIG. 1B is a top view of the first structure of the flexible OLED display panel according to the embodiment of the present invention.

FIG. 1A and FIG. 1B are respectively a bottom view and a top view of a first structure of a flexible organic light emitting diode (OLED) display panel according to an embodiment of the present invention.

In the embodiment, the flexible organic light emitting diode display panel 1000 comprises a flexible substrate 100 and an elastic material layer 300. The flexible substrate 100 has a folding zone X and two non-folding zones Y located on left and right sides of the folding zone X. The elastic material layer 300 is disposed over a bottom surface of the flexible substrate 100 corresponding to the folding zone X.

The flexible substrate 100 is generally made of a flexible material. For example, the material of the flexible substrate 100 may be polyimide (PI) or polyethylene terephthalate (PET). This facilitates the folding of the display panel 1000.

The flexible organic light emitting diode display panel 1000 may further comprise a display device layer 200. The display device layer 200 is disposed over the flexible substrate 100. It can be understood that a plurality of display devices (not shown) are formed in the display device layer 200, and the display devices are configured to display an image, so that a region in which the display device layer 200 is located defines a display region 350. Further, the folding zone X extends and covers the display region 350. That is, the folding zone X extends from an upper side 110 of the flexible substrate 100 to a lower side 120 of the flexible substrate 100.

Figure 2A:
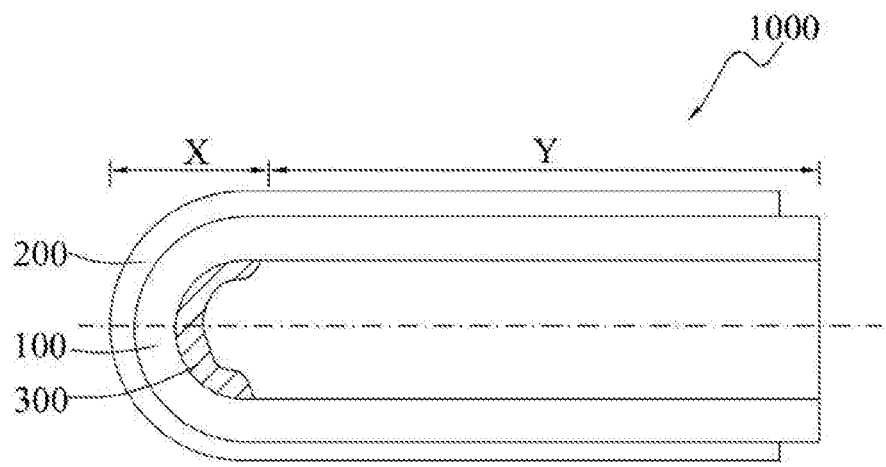
FIG. 2A is a cross-sectional side view of the first structure of the flexible OLED display panel in an outwardly folded state according to the present invention.
Figure 2B:
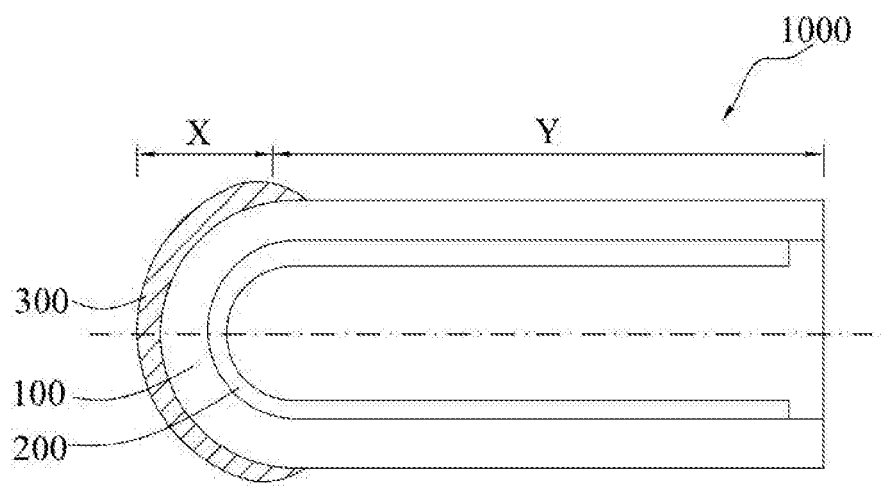
FIG. 2B is a cross-sectional side view of the first structure of the flexible OLED display panel in an inwardly folded state according to the present invention.

Please refer to FIG. 2A and FIG. 2B at the same time, which are cross-sectional side views of the first structure of the flexible organic light emitting diode display panel according to the present invention in an outwardly folded state and an inwardly folded state, respectively. The elastic material layer 300 has good elastic properties, and the elastic material layer 300 can be rapidly restored to the original shape even after being folded and deformed for numerous times. Therefore, during the return of the display panel 1000 from the folded state (for example, the outwardly folded state of FIG. 2A or the inwardly folded state of FIG. 2B) to the initial state (i.e., the fully flat unfolded state of the display panel), the elastic material can quickly return to the original flat shape to ensure that the display panel can quickly return to the initial state, thereby solving the problem that the display panel itself cannot be completely restored from the folded state to the initial state due to the technical problem resulting from fatigue of material after being folded for numerous times.

Referring again to FIG. 1A, the elastic material layer 300 has a pattern consisting of a single rectangular body 310. In order to optimally improve the folding performance of the display panel 1000, the single rectangular body 310 covers the entire folding zone X.

In addition, the material of the elastic material layer 300 may be an elastic metal alloy or an elastic polymer material, or other materials having similar properties. If the material of the high elastic material layer 300 is an elastic metal alloy, the elastic metal alloy may be an iron-based elastic alloy, a cobalt-based elastic alloy, or a nickel-based elastic alloy. If the material of the elastic material layer 300 is an elastic polymer material, the elastic polymer material may be styrene-butadiene rubber or nitrile-butadiene rubber.

The elastic material layer 300 can be adhered to the bottom surface of the flexible substrate 100 via various known methods, such as by means of an adhesive. The elastic material layer 300 is adhered to the bottom surface of the flexible substrate 100 corresponding to the folding zone X, so that the elastic material layer 300 of the single rectangular body 310 can cover the entire folding zone X to optimally improve the folding performance of the display panel 1000.

Figure 3A:
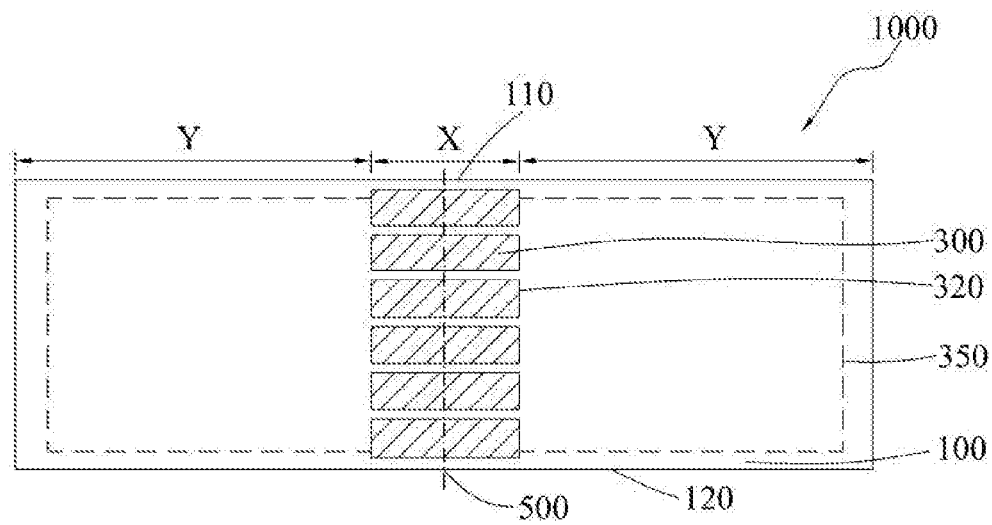
FIG. 3A is a bottom view of a second structure of a flexible OLED display panel according to an embodiment of the present invention.
Figure 3B:
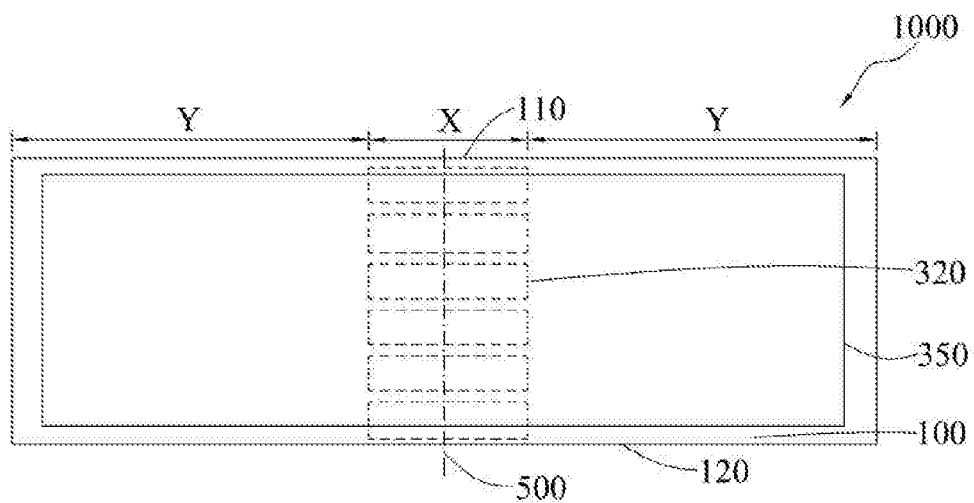
FIG. 3B is a top view of the second structure of the flexible OLED display panel according to the embodiment of the present invention.

Please refer to FIG. 3A and FIG. 3B, which are a bottom view and a top view of a second structure of a flexible organic light emitting diode display panel according to an embodiment of the invention, respectively. In addition, please refer to FIG. 4A and FIG. 4B, which are a bottom view and a top view of a third structure of a flexible organic light emitting diode display panel according to an embodiment of the invention, respectively.

In addition to the pattern of the single rectangular body 310 described above, the elastic material layer 300 may have other different patterns.

In the embodiment of FIG. 3A, the elastic material layer 300 may have a pattern of a plurality of rectangular bodies 320 arranged side by side with a fixed gap therebetween. A center line between the two short sides of each of the rectangular bodies 320 overlaps with a vertical center line 500 of the folding zone X. Compared to the first structure of FIG. 1A, the pattern of the elastic material layer 300 shown in the second structure of FIG. 3A uses a relatively less amount of elastic material, so the manufacturing cost of the second structure is less than that of the first structure.

Figure 4A:
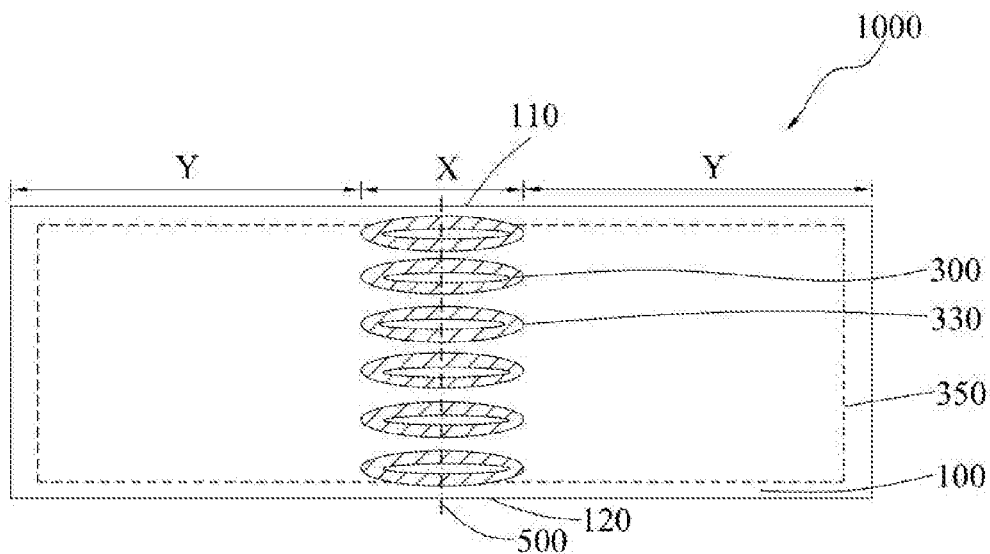
FIG. 4A is a bottom view of a third structure of a flexible OLED display panel according to an embodiment of the present invention.
Figure 4B:
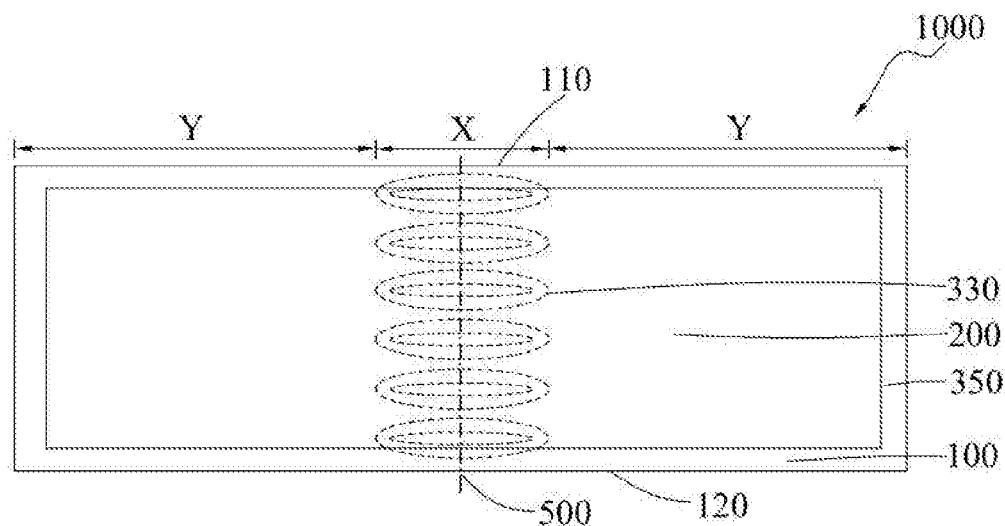
FIG. 4B is a top view of the third structure of the flexible OLED display panel according to the embodiment of the present invention.

In addition, in the embodiment of FIG. 4A, the elastic material layer 300 may have a pattern consisting of a plurality of elliptical annular bodies 330 arranged side by side with a fixed gap therebetween. The minor axe of each of the elliptical annular bodies 330 overlaps the vertical center line 500 of the folding zone X. Compared with the second structure of FIG. 3A, the pattern of the elastic material layer 300 shown in the third structure of FIG. 4A uses an even less amount of the elastic material, so the manufacturing cost of the third structure is less than that of the second structure. In more detail, since stress generated by the folding is mainly concentrated at the vertical center line 500 of the folding zone, fatigue of material property mainly occurs there. The elliptical annular bodies of FIG. 4A are designed such that the vertical center line of the folding zone has a relatively greater amount of elastic material usage at the leftmost and rightmost sides of the folding zone. Moreover, the side-by-side arrangement with a with a fixed gap therebetween also enables the elastic material at the vertical center line of the folding zone to be spaced apart from each other in the vertical direction to be evenly distributed. Therefore, the third structure can solve the technical problem that the display panel in the prior art cannot completely return from the folded state to the initial state.

In view of the manufacturing cost, production yield, and process limitation of the display panel, the present invention does not specifically limit the position, shape, and size of the elastic material layer. In general, the location, shape, and size of the elastic material layer depend on the specifications of different display products and the needs of the user. As the elastic material layer can quickly return the display panel to the initial state, the position, shape and size of the high elastic material layer fall within the protection scope of the present invention.

The embodiment of the present invention further provides a foldable display device, which comprises a flexible organic light emitting diode (OLED) display panel 1000. The flexible organic light emitting diode display panel 1000 comprises a flexible substrate 100 and an elastic material layer 300. The flexible substrate 100 comprises a folding zone X and two non-folding zones Y located on left and right sides of the folding zone X. The elastic material layer 300 is disposed over a bottom surface corresponding to the folding zone X of the flexible substrate 100.

In the embodiment of the present invention, the elastic material layer 300 has a pattern consisting of a single rectangular body, a plurality of rectangular bodies arranged side-by-side with a fixed gap therebetween, or a plurality of elliptical annular bodies arranged side-by-side with a fixed gap therebetween.

In the embodiment of the present invention, the elastic material layer 300 is made of an elastic metal alloy or an elastic polymer material.

In the embodiment of the present invention, the elastic metal alloy is an iron-based elastic alloy, a cobalt-based elastic alloy, or a nickel-based elastic alloy.

In the embodiment of the present invention, the elastic polymer material is styrene-butadiene rubber or nitrile-butadiene rubber.

In the above embodiments, the descriptions of the various embodiments are different, and the details that are not described in a certain embodiment can be referred to the related descriptions of other embodiments.

Compared with the prior art, the present invention provides a flexible organic light emitting diode display panel and a foldable display device. According to the present invention, an elastic material is disposed over the bottom surface of the flexible substrate corresponding to a folding zone. Therefore, the elastic material layer can rapidly return to the original flat shape during the process of unfolding the display panel from a folded state to the initial state, thereby solving the technical problems that the display panel cannot be completely restored from the folded state to the initial state due to fatigue of material property after dynamically and repeatedly folding thereof for many times.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A flexible organic light emitting diode display panel, comprising:
   a flexible substrate, comprising a folding zone and two non-folding zones located on left and right sides of the folding zone; and
   an elastic material layer disposed over a bottom surface corresponding to the folding zone of the flexible substrate,
   wherein the elastic material layer has a pattern consisting of a plurality of rectangular bodies arranged side-by-side with a fixed gap therebetween or a plurality of elliptical annular bodies arranged side-by-side with a fixed gap therebetween.

2. The flexible organic light emitting diode display panel according to claim 1, wherein the elastic material layer is made of an elastic metal alloy or an elastic polymer material.

3. The flexible organic light emitting diode display panel according to claim 2, wherein the elastic metal alloy is an iron-based elastic alloy, a cobalt-based elastic alloy, or a nickel-based elastic alloy.

4. The flexible organic light emitting diode display panel according to claim 2, wherein the elastic polymer material is styrene-butadiene rubber or nitrile-butadiene rubber.

5. A foldable display device, comprising a flexible organic light emitting diode display panel, wherein the flexible organic light emitting diode display panel comprises:
   a flexible substrate, comprising a folding zone and two non-folding zones located on left and right sides of the folding zone; and
   an elastic material layer disposed over a bottom surface corresponding to the folding zone of the flexible substrate,
   wherein the elastic material layer has a pattern consisting of a plurality of rectangular bodies arranged side-by-side with a fixed gap therebetween or a plurality of elliptical annular bodies arranged side-by-side with a fixed gap therebetween.

6. The foldable display device according to claim 5, wherein the elastic material layer is made of an elastic metal alloy or an elastic polymer material.

7. The foldable display device according to claim 6, wherein the elastic metal alloy is an iron-based elastic alloy, a cobalt-based elastic alloy, or a nickel-based elastic alloy.

8. The foldable display device according to claim 6, wherein the elastic polymer material is styrene-butadiene rubber or nitrile-butadiene rubber.

* * * * *